United States Patent
Liu et al.

(10) Patent No.: US 7,902,646 B2
(45) Date of Patent: Mar. 8, 2011

(54) MULTIPHASE SYNCHRONOUS BUCK CONVERTER

(75) Inventors: Yong Liu, Scarborough, ME (US);
Tiburcio A. Maldo, Suzhou (CN); Hua Yang, Suzhou (CN)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/723,128

(22) Filed: Mar. 12, 2010

(65) Prior Publication Data

US 2010/0167465 A1  Jul. 1, 2010

Related U.S. Application Data

(60) Division of application No. 12/020,892, filed on Jan. 28, 2008, now Pat. No. 7,696,612, and a continuation of application No. 12/405,525, filed on Mar. 17, 2009.

(51) Int. Cl.
*H01L 23/495* (2006.01)

(52) U.S. Cl. .... 257/666; 257/76; 257/686; 257/E23.042; 438/123; 438/109

(58) Field of Classification Search .................. 257/666, 257/E23.042

See application file for complete search history.

(56) References Cited

U.S. PATENT DOCUMENTS

| | | | |
|---|---|---|---|
| 6,803,750 B2 | 10/2004 | Zhang | |
| 2007/0249092 A1 | 10/2007 | Joshi | |
| 2008/0024102 A1* | 1/2008 | Hebert et al. | 323/282 |
| 2008/0061396 A1* | 3/2008 | Havanur | 257/500 |
| 2009/0160036 A1* | 6/2009 | Grey | 257/666 |
| 2009/0189262 A1 | 7/2009 | Liu et al. | |
| 2009/0189266 A1* | 7/2009 | Liu et al. | 257/686 |
| 2009/0189273 A1 | 7/2009 | Liu et al. | |

* cited by examiner

*Primary Examiner* — Ajay K Arora
(74) *Attorney, Agent, or Firm* — Thomas R. FitzGerald, Esq.; Hiscock & Barclay, LLP

(57) ABSTRACT

Disclosed in this specification is a multiphase buck converter package and process for forming such package. The package includes at least four dies and at least nine parallel leads. The dies are electrically connected through a plurality of die attach pads, thus eliminating the need for wirebonding.

7 Claims, 11 Drawing Sheets

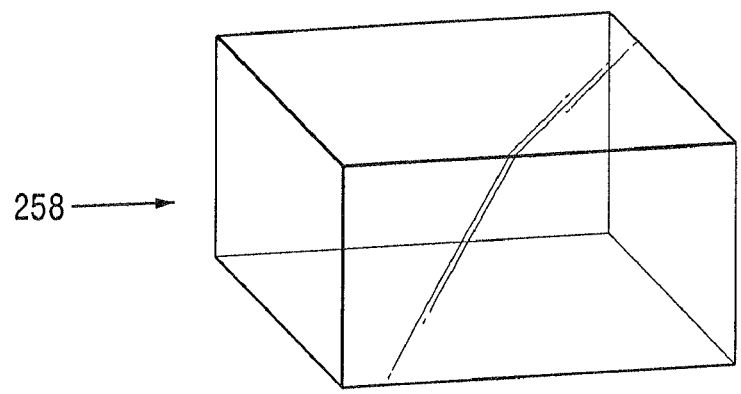
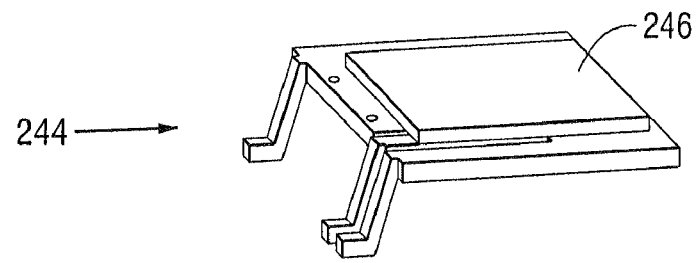
FIG. 5
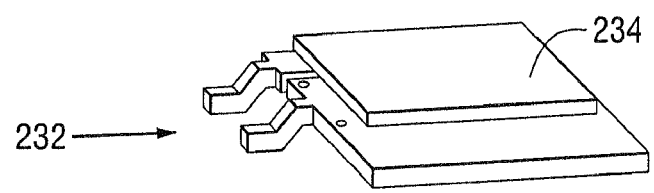
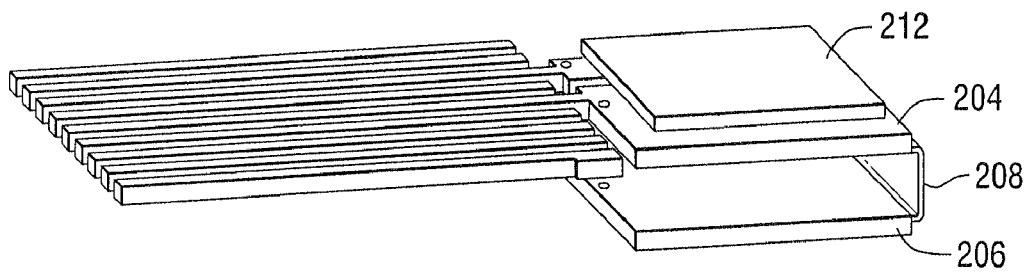
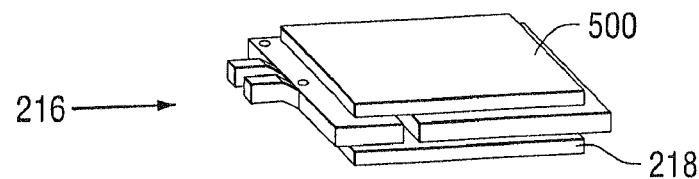

MULTIPHASE SYNCHRONOUS BUCK CONVERTER

CROSS-REFERENCE TO RELATED APPLICATIONS

This application claims priority to and is a divisional of co-pending U.S. patent application Ser. No. 12/020,892, filed Jan. 28, 2008, and is a continuation of co-pending U.S. patent application Ser. No. 12/405,525, filed Mar. 17, 2009, which applications are incorporated herein by reference in their entirety.

FIELD OF THE INVENTION

This invention relates, in one embodiment, to a multiphase buck converter package. A single molded package is provided which incases at least four MOSFET dice and a plurality of leads. The dice are electrically connected in a predetermined using lead frame. Wirebonding techniques are not required to connect the dice. In one embodiment, the leads all extend in the same direction.

BACKGROUND OF THE INVENTION

Buck converters are switching circuits that downgrades a received voltage to a lower, output voltage. Such circuits are commonly used to power microprocessors, wherein the voltage desired by the microprocessor is substantially lower than the voltage supplied by the power supply. In a multiphase buck converter, a plurality of dice are operated in sequence to downgrade the voltage. Thus, each die contributes a portion of the desired current. Reference may be had to U.S. Pat. No. 6,803,750 to Zhang (Multiphase Synchronous Buck Converter with Improved Current Sharing).

Unfortunately, prior art multiphase buck converters are not modular units. Therefore, a multiphase buck converter package is desired which would easily permit a user to add such a converter to an existing circuit.

SUMMARY OF THE INVENTION

The invention comprises, in one form thereof, a multiphase buck converter package. The package includes at least four dice and at least nine parallel leads. The dices are electrically connected through a plurality of die attach pads, thus eliminating the need for wirebonding.

An advantage of the present invention is the modular nature of the package. A user may easily add a multiphase buck converter package into an existing circuit to optimize a system to increase its ability to respond to dynamic changes in the load current, resulting in a significant improvement in performance.

BRIEF DESCRIPTION OF THE DRAWINGS

The present invention is disclosed with reference to the accompanying drawings, wherein:

FIG. 5 is an exploded view of the first embodiment;

Corresponding reference characters indicate corresponding parts throughout the several views. The examples set out herein illustrate several embodiments of the invention but should not be construed as limiting the scope of the invention in any manner.

DETAILED DESCRIPTION OF A PREFERRED EMBODIMENT

Figure 1:
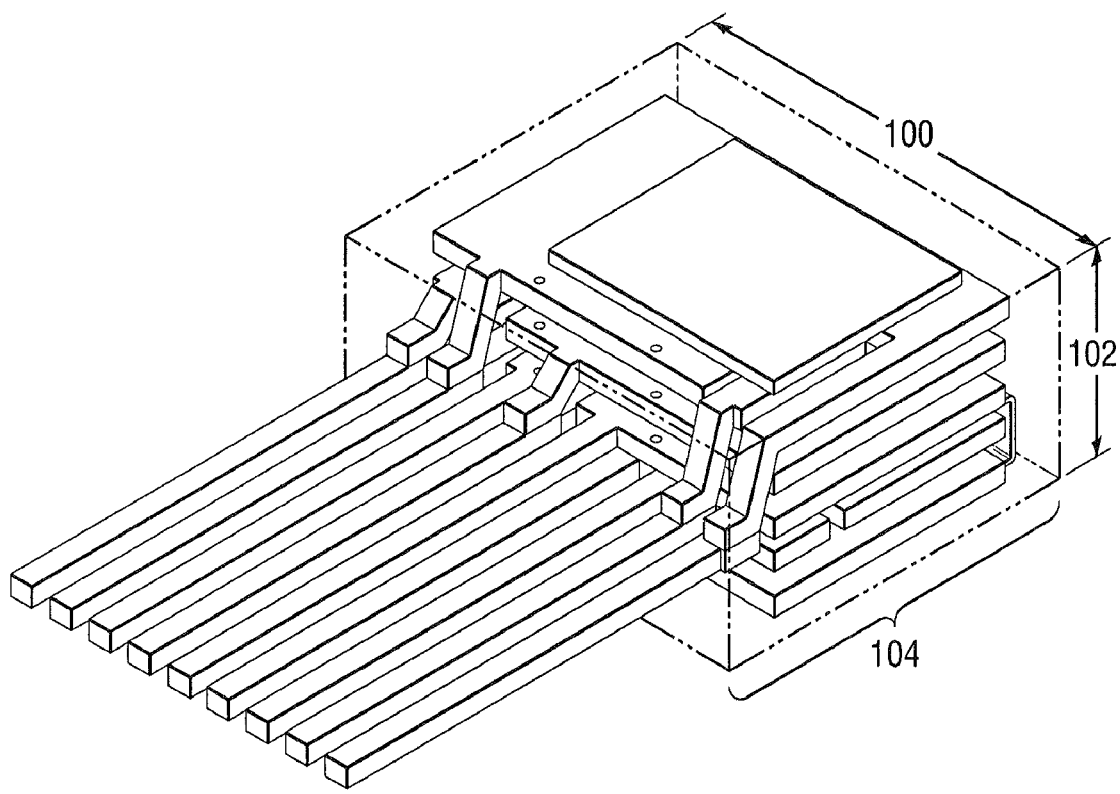
FIG. 1 is a perspective view of a first embodiment of the invention.
Figure 2:
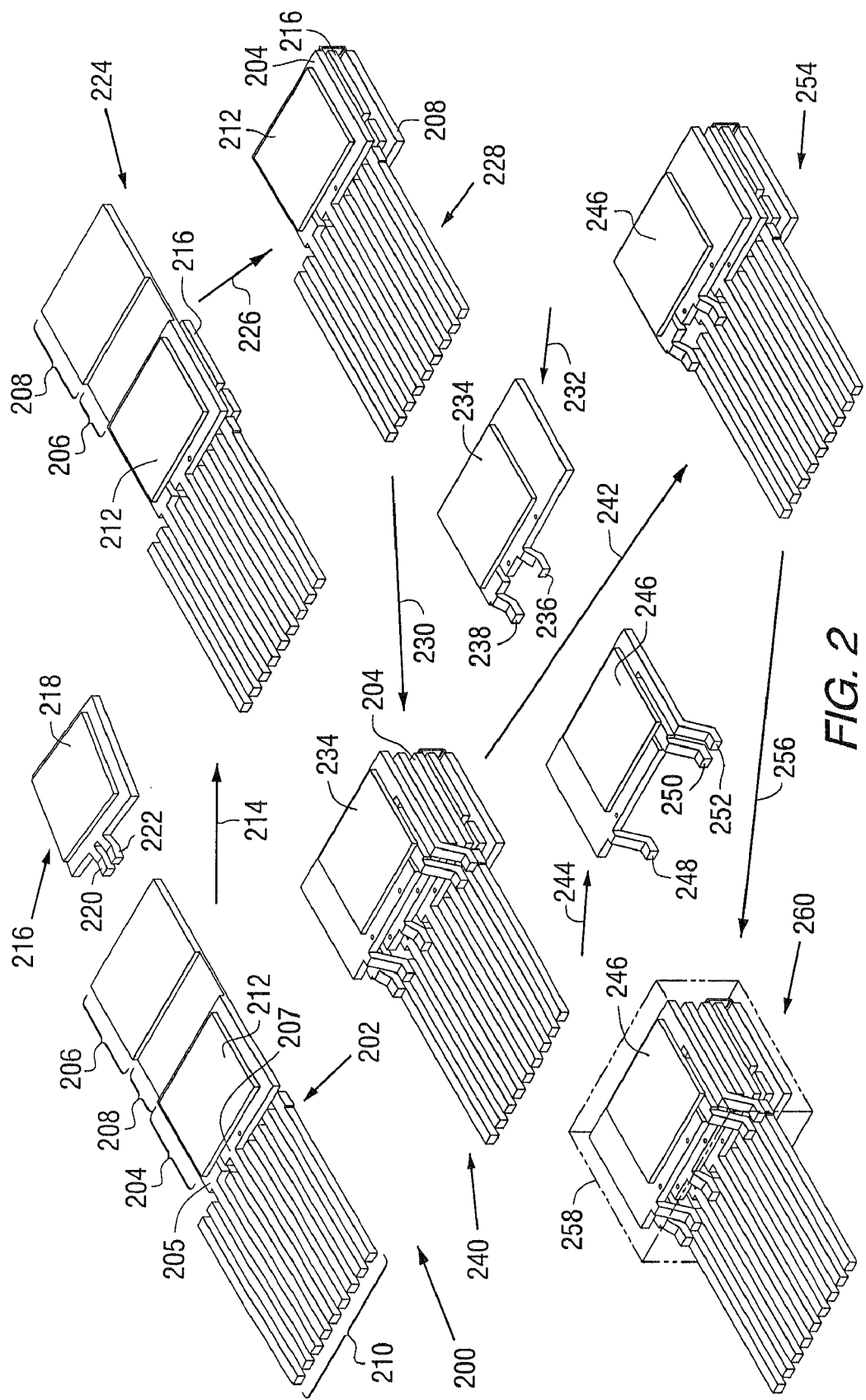
FIG. 2 is a flow diagram of a process for forming the first embodiment.

Referring to FIG. 1, a multiphase buck converter package is shown. The embodiment of FIG. 1 has a certain width 100 and a height 102 suitable to accommodate a plurality of die attach pads 104 in a vertical configuration. In other embodiments (see FIG. 6) the width and height may be altered to accommodate non-vertical configurations. FIG. 2 is a flow diagram depicting a process for forming the buck converter package of FIG. 1.

Process 200 of FIG. 2 begins with first lead frame 202. First lead frame 202 includes a plurality of leads 210, a first die attach pad 204, a second die attach pad 206, and a bridge 208 connecting pad 204 and pad 206, as well as first die 212. In the embodiment shown in FIG. 2, first lead 205 is the gate lead which is separated from first pad 204, while second lead 207, bridge 208, first pad 204 and second pad 206 are unitary. In one embodiment, connecting bridge 208 is thinner than pads 204 and 206. Such a configuration facilitates the bending operation performed in step 226. The other leads shown in FIG. 2 are not connected to die attach pad 204.

As shown in FIG. 2, first die 212 has been mounted to first pad 204 such that the source of first die 212 is electrically connected to second lead 207 and the gate of first die 212 is electrically connected to first lead 205. The drain of first die 212 is exposed.

In step 214 of process 200, a third die attach pad 216 is attached to the underside of first pad 204. After attachment, the third die attach pad 216 is disposed in a plane that is parallel to, but separated from, the planes of both first pad 204 and second pad 206. Third die attach pad 216 includes second die 218 whose source is connected to third lead 222 and whose gate is connected to fourth lead 220. In FIG. 2, third pad 216 is shown in an inverted state to better depict second die 218. The bottom surface (not shown) of third pad 216 is protected with a layer of insulating material. In step 214, third pad 216 is attached to die attach 204 such that the insulating material is adjacent to the bottom surface of pad 204. Third lead 222 and fourth lead 220 are extended in length by contacting corresponding leads from the plurality of leads 210. In this manner, the source of second die 218 has been connected to third lead 222 and the gate of second die 218 has been connected to fourth lead 220. The drain of first die 212 and second die 218 are exposed in step 214.

In step 226, second die attach pad 206 is bent about bridge 208 to form assembly 224 such that second die attach pad 206 contacts the exposed drain of second die 218. In FIG. 2, bridge 208 is bent into a simple U shape, although other shapes are permissible. Step 214 connects the drain of second die 218 to second lead 207 by forming an electrical pathway from the drain of second die 218, through the second pad 206, the bridge 208, first pad 204, and finally to second lead 207. The second die attach pad 206 is now disposed in a plane parallel to, but separated from, the planes of the first pad 204 and third pad 216. The drain of first die 212 remains exposed.

In step 230 a fourth die attach pad 232 is mounted atop the drain of first die 212. The fourth die attach pad 232 is disposed in a plane that is parallel to, but separated from, the planes of the first pad 204, second pad 206, and third pad 216. Fourth die attach pad 232 includes third die 234 whose gate is connected to fifth lead 238 and whose source is connected to sixth lead 236. Fifth lead 238 and sixth lead 236 are extended in length by contacting corresponding leads from the plurality of leads 210. The bottom surface of fourth pad 232 contacts the exposed drain of first die 212. In this manner, the source of third die 234 has been connected to sixth lead 236, the gate of third die 234 has been connected to fifth lead 238, and the drain of first die 212 has been connected to both the source of third die 234 and to sixth lead 236 (both through third pad 232). In assembly 240, the drain of third die 234 is exposed.

In step 242 of process 200, fifth die attach pad 244 is mounted atop the exposed drain of third die 234. Fifth die attach pad 244 includes fourth die 246 whose source is connected to seventh lead 248, and whose gate is connected to eighth lead 250, and whose drain is connected to ninth lead 252. Seventh lead 248, eighth lead 250 and ninth lead 252 are extended in length by contacting corresponding leads from the plurality of leads 210. After mounting, seventh lead 248 is now connected to the source of fourth die 246 and the drain of third die 234 (through fifth die attach pad 244).

In step 256, assembly 254 is encased in molding compound 258 to form package 260. The resulting assembly is comprised of four dies which are connected in series. Such a configuration is represented schematically in FIG. 3.

Figure 3:
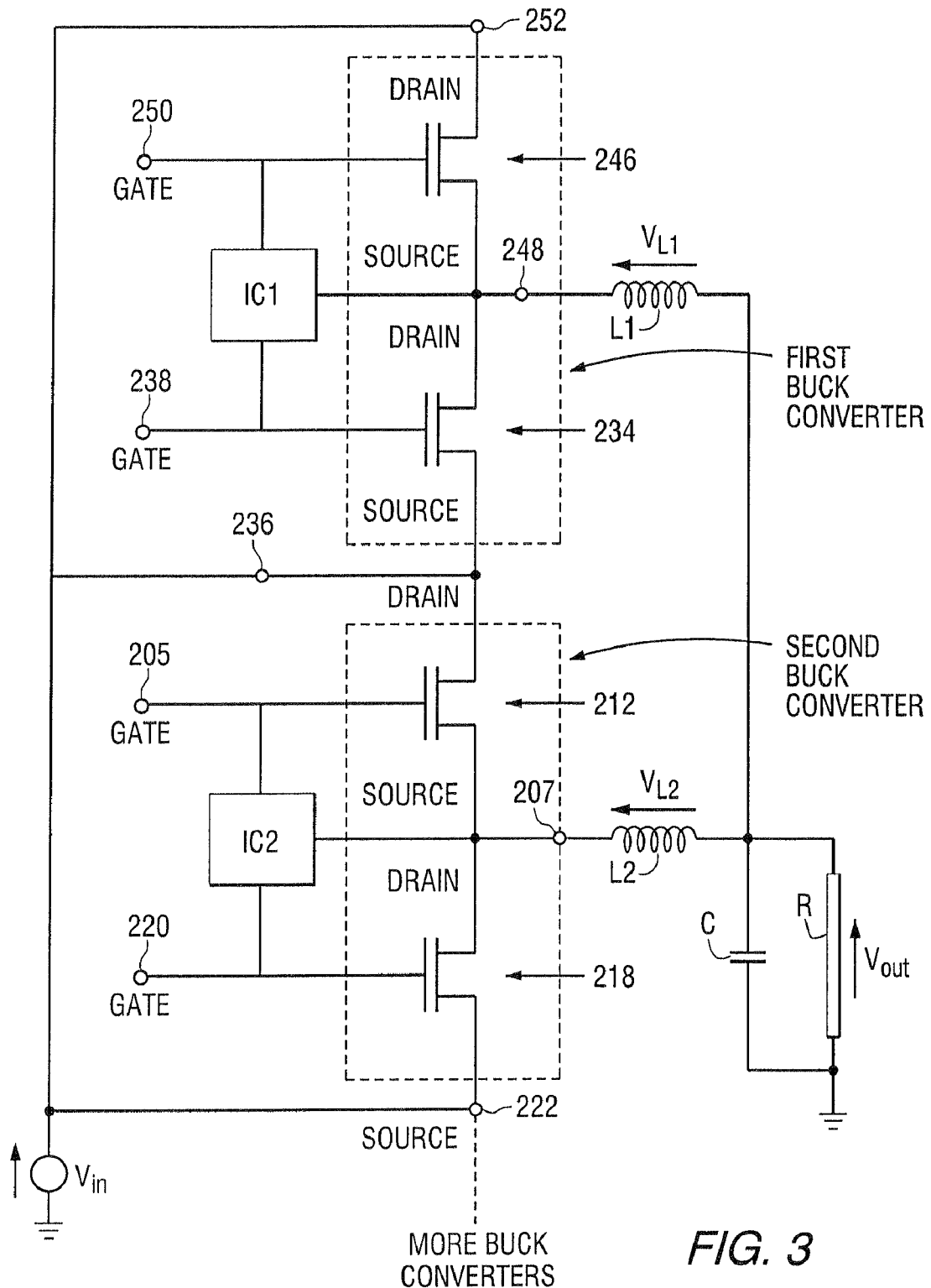
FIG. 3 is a schematic diagram of the circuit of the first embodiment.

FIG. 3 is a schematic diagram of one embodiment of the invention for a two phase buck converter. In FIG. 3, seventh lead 248 connects to an inductor L1 and second lead 207 connects to an inductor L2. High side gate lead 250 and low side gate lead 238 of the first buck converter are connected to a driver chip IC1 which controls the high side and low side switch of the first buck converter. High side gate lead 205 and low side gate lead 220 of the second buck converter are connected to a driver chip IC2 which controls the high side and low side switch of the second buck converter.

Figure 4:
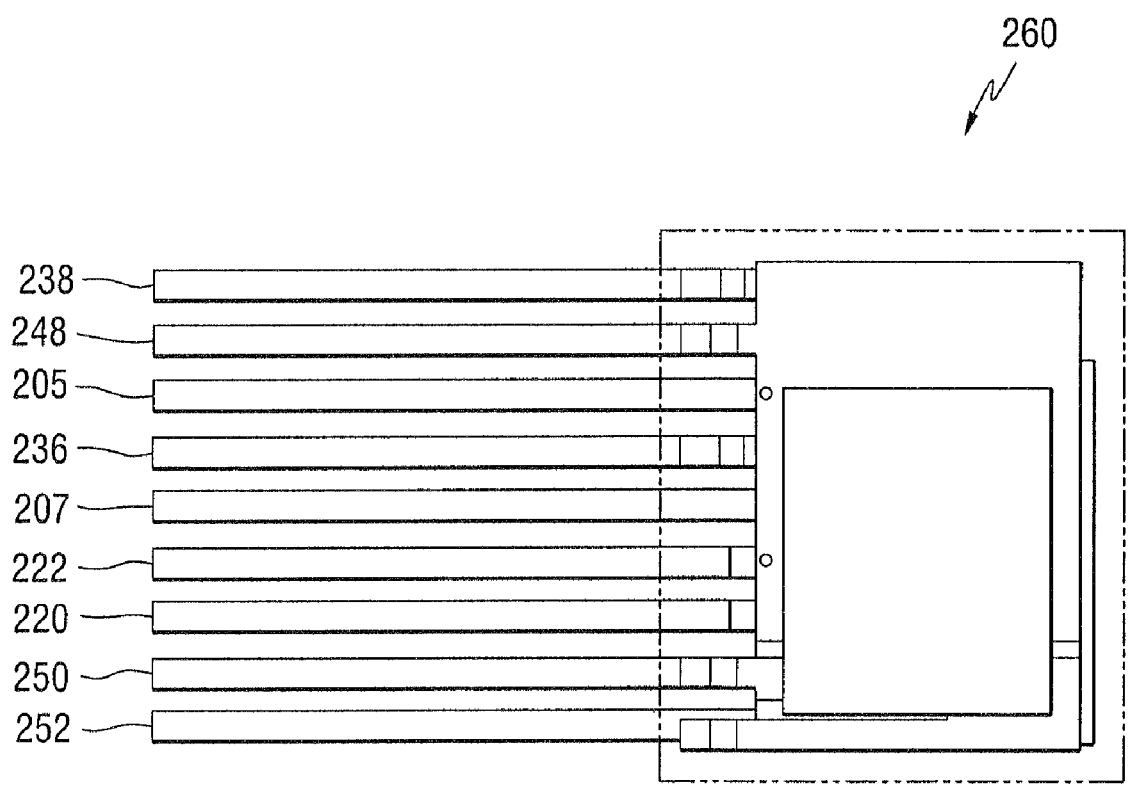
FIG. 4 is a top view of the first embodiment illustrating the various leads.

FIG. 4 is a depiction of the function of the various leads of package 260. Lead 238 is the gate lead for third die 234. Lead 248 connects to the source of the fourth die 246 and drain of the third die 234. Lead 205 is the gate lead for first die 212. Lead 236 connects to the source of third die 234 and to the drain of first die 212. Lead 207 connects to the source of first die 212 and the drain of second die 218. Lead 222 is the source lead for second die 218. Lead 220 is the gate lead for second die 218. Lead 250 controls the gate of fourth die 246. Lead 252 is the drain lead for fourth die 246.

FIG. 5 is an exploded view of the components of the package of FIG. 1. The insulating material 500 that is disposed between first pad 204 and second pad 216 is visible in this view.

Figure 6:
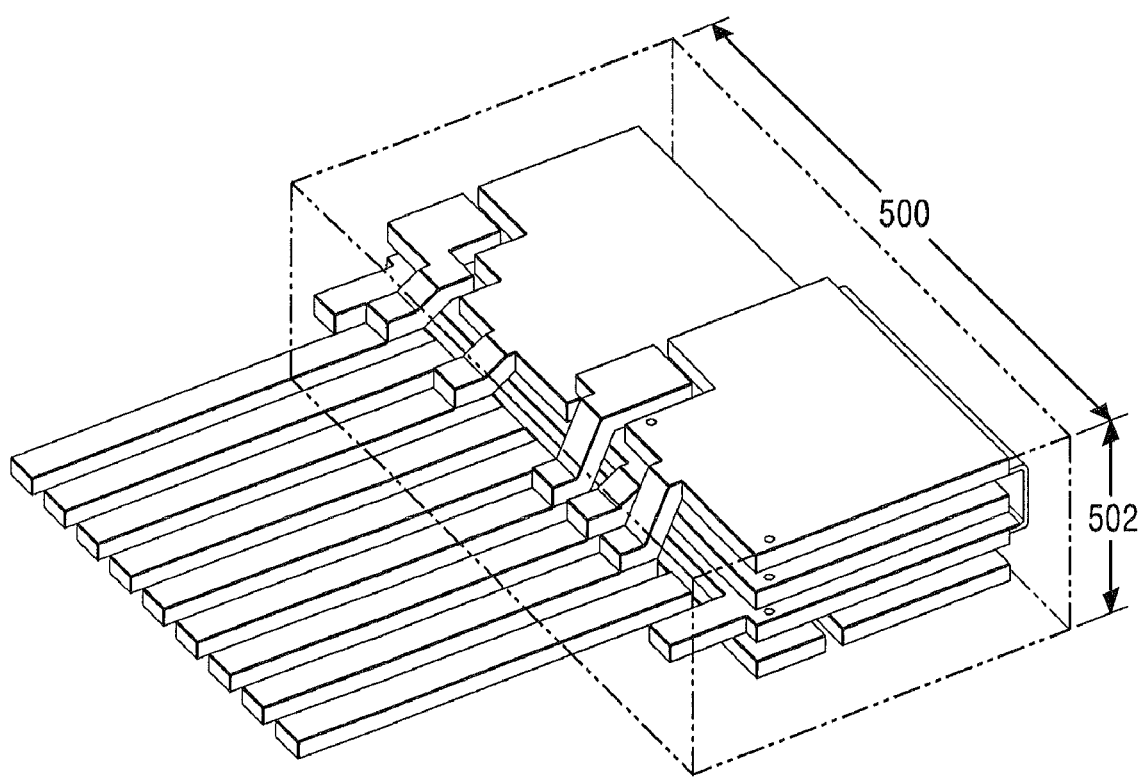
FIG. 6 is a perspective view of a second embodiment of the invention.

FIG. 6 is a perspective view of another embodiment of the invention. In FIG. 6, the package has a width 500 and height 502. Width 500 of FIG. 6 is substantially longer than width 100 of FIG. 1, while height 502 is substantially smaller than height 102. Each of the embodiments shown in FIGS. 1 and 2 are useful in different situations.

Figure 7:
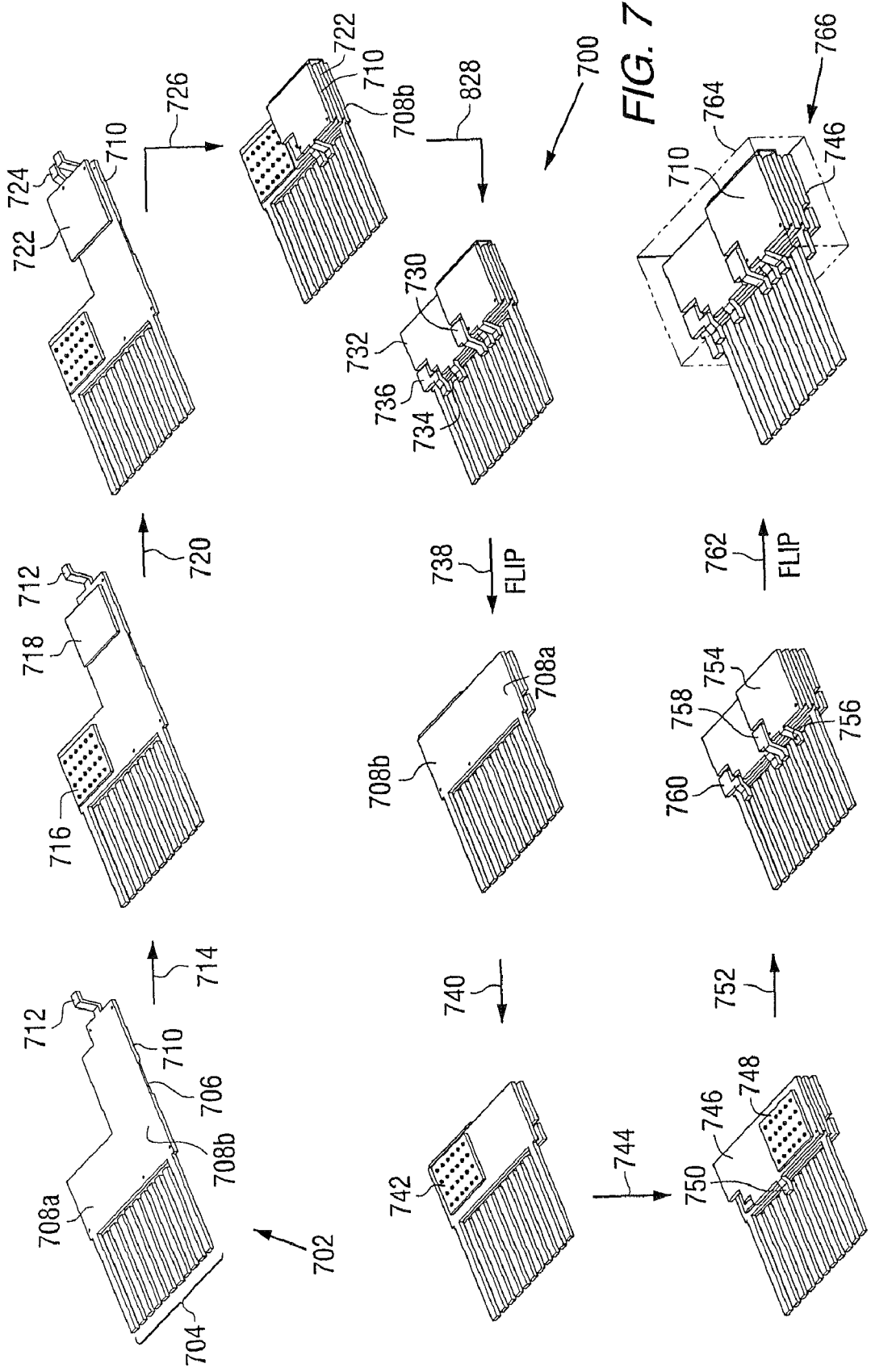
FIG. 7 is a flow diagram of a process for forming the second embodiment.

FIG. 7 is a flow diagram of a process 700 for forming the package of FIG. 6. Process 700 begins with lead frame 702, which includes first die attach pad 708a, second die attach pad 708b, and third die attach pad 710. Second pad 708b and third pad 710 are joined by conductive bridge 706. Lead frame 702 also includes a plurality of leads 704. In the embodiment depicted in FIG. 7, the two flanking leads, the first pad 708a, second pad 708b, third pad 710 and bridge 706 are unitary. The non-flanking leads will be connected to the internal components of the package during subsequent steps. Third pad 710 includes first lead 712.

In step 714 of process 700, first die 716 and second die 718 are mounted to lead frame 702. First die 716 is flip-chip mounted, such that the drain of first die 716 contacts first pad 708a. Second die 716 is mounted in a conventional fashion such that the source of second die 718 contacts third pad 710. This places lead 712 in electrical contact with both the drain of first die 716 and the source of second die 718.

In step 720, fourth die attach pad 722 is mounted to second die 718 such that is contacts the drain of die 718. Fourth pad 722 includes second lead 724, which is now in electrical contact with the drain of second die 718.

In step 726 of process 700, bridge 706 is bent such that third pad 710 is disposed atop second pad 708b. When first lead 712 and second lead 724 contact corresponding leads of the plurality of leads 704, the length of first lead 712 and second lead 724 are extended. Contact between the exposed surface of fourth pad 722 and second pad 708b is prevented. Such contact may be prevented by coating the exposed surface of fourth pad 722 with an insulating material or by simply leaving a space between fourth pad 722 and second pad 708b.

In step 728 fifth die attach pad 732, which includes third lead 734, is mounted atop first die 716 such that the source of first die 716 contacts fifth pad 732. The length of third lead 734 is extended by contact with one of the leads of the plurality of leads 704. Also in step 728, fourth lead 736 is attached to the gate of first die 716 and fifth lead 730 is attached to the gate of second die 718.

In step 738, the assembly is flipped to perform operations on the bottom side of lead frame 702. In another embodiment, not shown, the operations are performed on the bottom of lead frame 702 without flipping the frame 702.

In step 740 of process 700, third die 742 is mounted to the bottom of second pad 708b such that the drain of third die 742 is connected to first lead 712.

In step 744, sixth die attach pad 746, which includes fourth die 748 and sixth lead 750. Fourth die 748 is mounted to sixth die attach pad 746 such that the drain of fourth die 748 contacts sixth pad 746, and thus sixth lead 750. The length of sixth lead 750 is extended by contact with one of the leads of the plurality of leads 704.

In step 752, seventh die attach pad 754 is mounted to fourth die 748 such that seventh pad 754 is connected to the source of fourth die 748. Seventh pad 754 includes seventh lead 756, which is extended in length by contact with one of the leads from the plurality of leads 704. In step 752, eighth lead 760 is connected to the gate of third die 742 and ninth lead 758 to the gate of fourth die 758.

In step 762, the assembly is encased within molding compound 764 to form assembly 766. In the embodiment depicted in FIG. 7, assembly 766 is show front a viewpoint such that third pad 710 is on top and sixth pad 746 is on the bottom.

Figure 8:
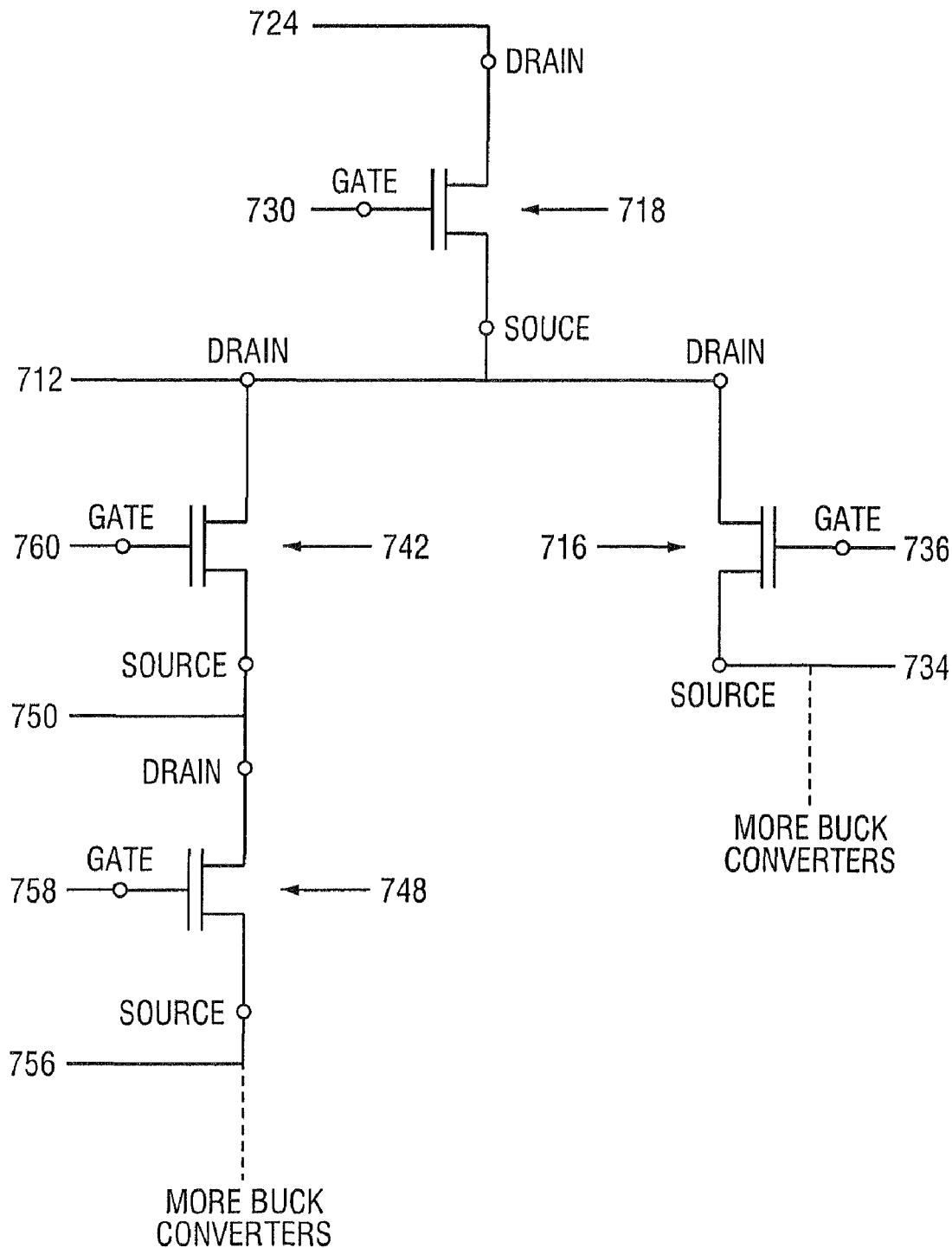
FIG. 8 is a schematic diagram of the circuit of the second embodiment.

FIG. 8 is a schematic diagram of the circuit of the embodiment shown in FIG. 6. This is a more flexible circuit connection which allows the users to have an option to add the embodiment to their own defined circuitry. The users may build or add more parallel buck converters under a switch through leads 734 and 756 to form any system the users wish to obtain.

Figure 9:
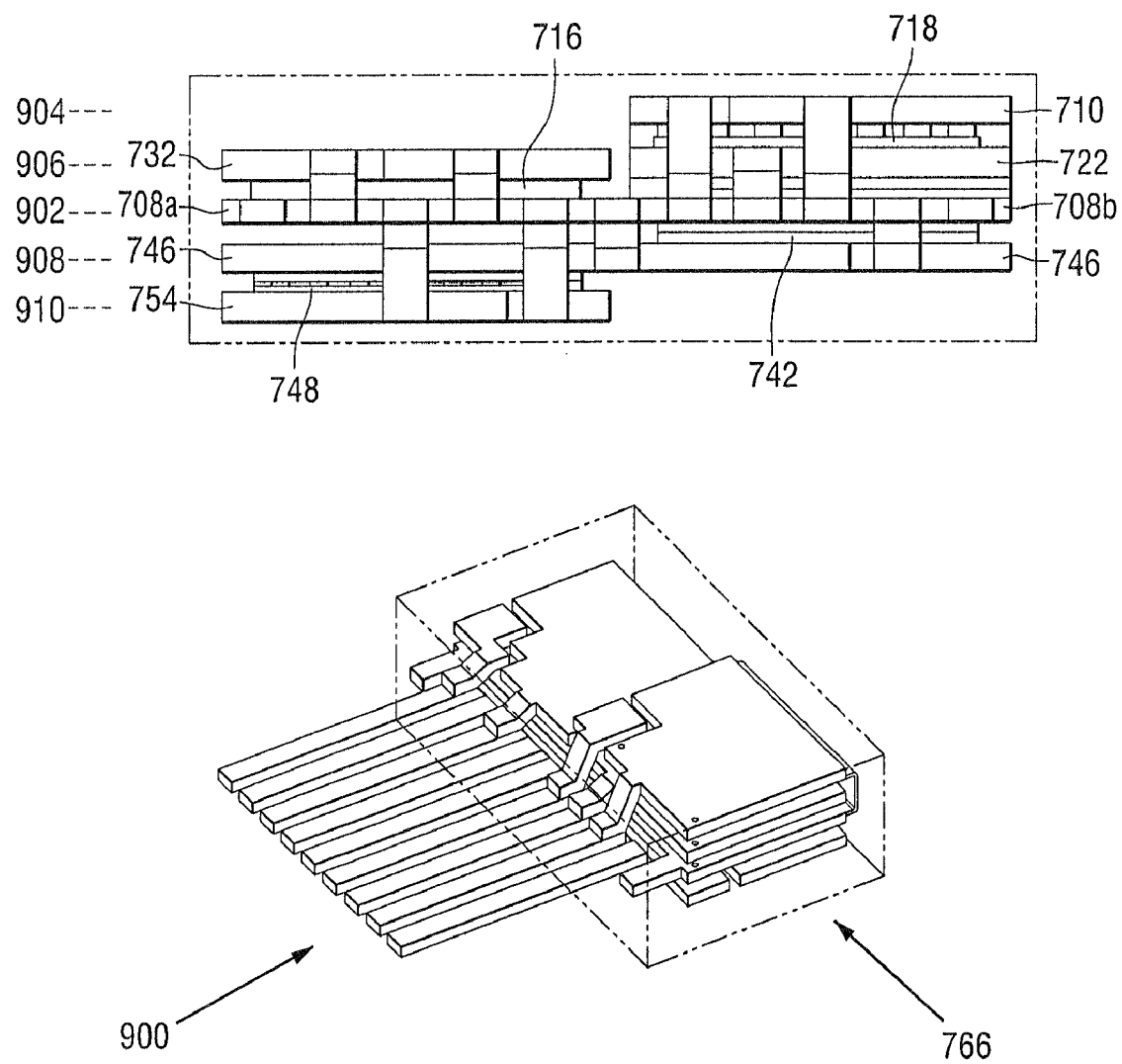
FIG. 9 is an end view of the second embodiment.

FIG. 9 is an end view of package 766 looking from the perspective of arrow 900. First die 716, second die 718, third die 742 and fourth die 748 are shown. First die attach pad 708a and second pad 708b are disposed in first plane 902. Third pad 710 is disposed in second plane 904. Fourth pad 722 and fifth pad 732 are both disposed in third plane 906. Sixth pad 746 is in fourth plane 908. Seventh pad 754 is in fifth plane 910.

Figure 10:
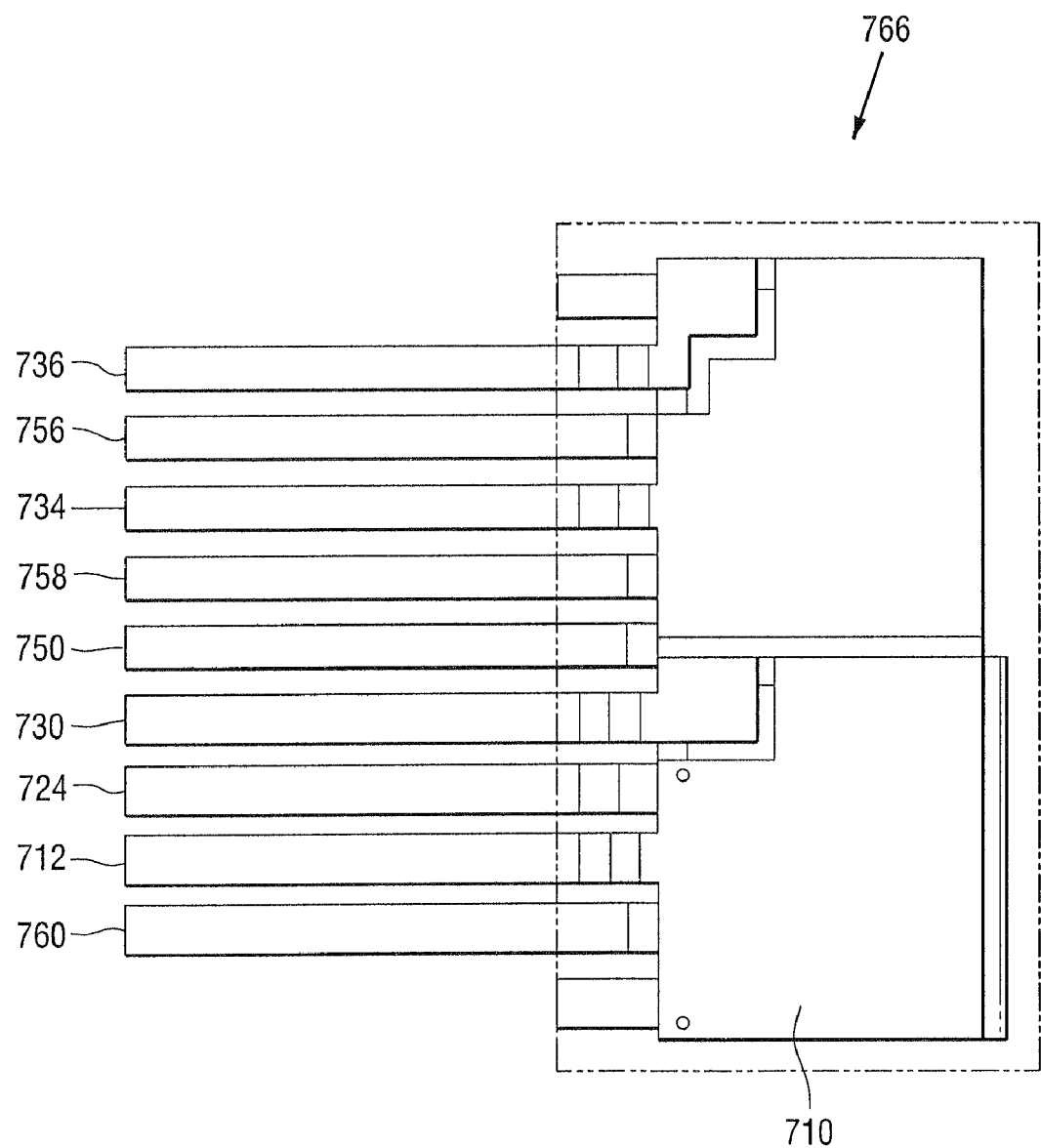
FIG. 10 is a top view of the second embodiment illustrating the various leads.

FIG. 10 illustrates the function of the various leads of package 766. FIG. 10 includes first die 716, second die 718, third die 742 and fourth die 748, which has a gate, source and drain. First lead 712 is connected to the third drain, first drain and second source. Second lead 724 is connected to the second drain. Third lead 734 is connected to the first source. Fourth lead 736 is connected to the first gate. Fifth lead 730 is connected to the second gate. Sixth lead 750 is connected to the third source and fourth drain. Seventh lead 756 is connected to fourth source. Eighth lead 760 is connected to the third gate. Ninth lead 758 is connected to the fourth gate.

Figure 11:
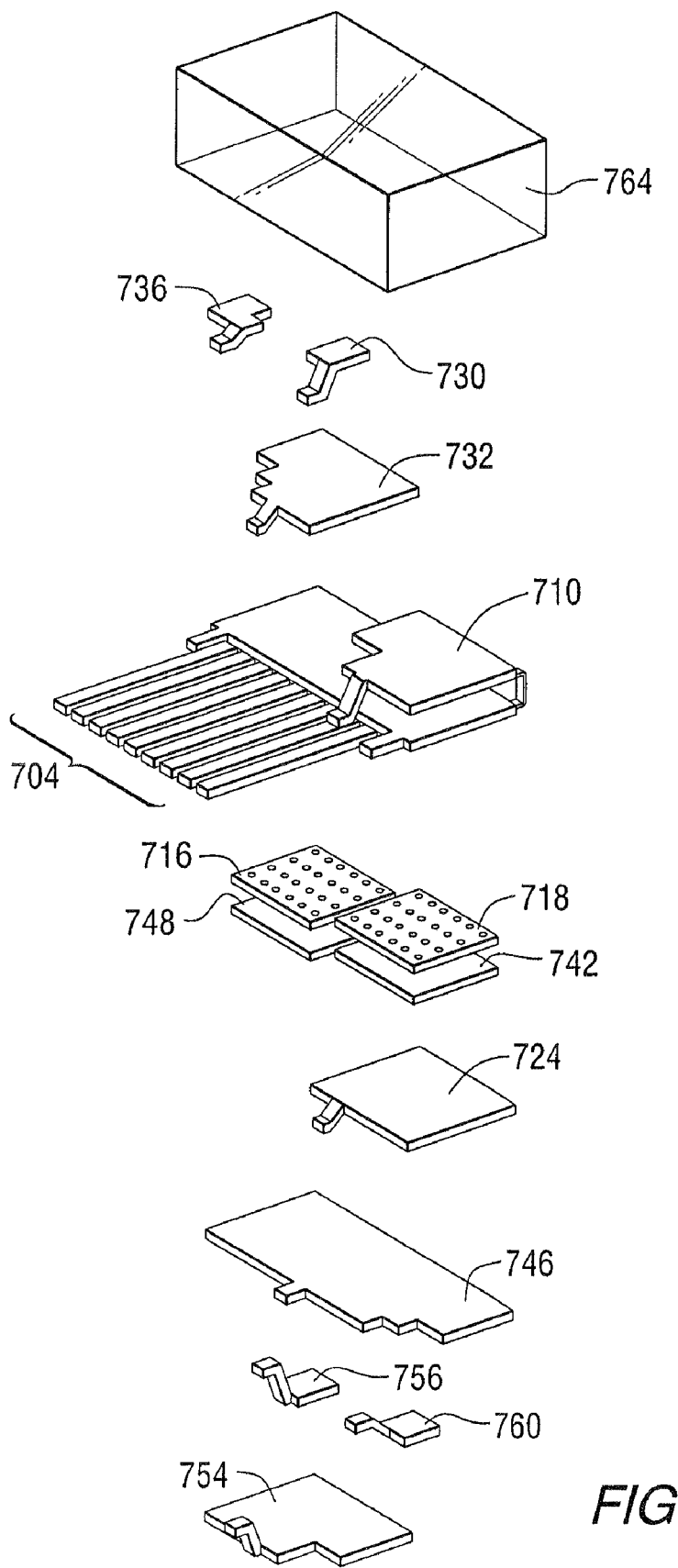
FIG. 11 is an exploded view of the second embodiment.

FIG. 11 is an exploded view of the components of the embodiment shown in FIG. 6.

While the invention has been described with reference to preferred embodiments, it will be understood by those skilled in the art that various changes may be made and equivalents may be substituted for elements thereof to adapt to particular situations without departing from the scope of the invention. Therefore, it is intended that the invention not be limited to the particular embodiments disclosed as the best mode contemplated for carrying out this invention, but that the invention will include all embodiments falling within the scope and spirit of the appended claims.

What is claimed is:

1. A process for forming a packaged multiphase buck converter, comprising the steps of:
providing a lead frame comprising a plurality of leads, a first die attach pad, a second die attach pad integral with the first die attach pad, a third die attach pad and a conductive bridge, each of which is electrically connected to the others, wherein the first and second die attach pads are in a first plane, the second die attach pad and third die attach pad being connected by the conductive bridge, the third die attach pad having a first lead;
mounting a first die, with a first source, a first gate, and a first drain, to the first die attach pad such that the first drain is electrically connected to the first die attach pad, and thus to the first lead;
mounting a second die, with a second source, a second gate, and a second drain, to the third die attach pad such that the second source is electrically connected to the third die attach pad, and thus to the first lead;
mounting a fourth die attach pad to the second drain, wherein the fourth die attach pad is in a plane parallel to, but separated from, the first plane, the fourth die attach pad having a second lead;
bending the conductive bridge such that the first and second leads contact the plurality of leads, and disposes the third die attach pad in a second plane parallel, but separated from, the first plane;
mounting a fifth die attach pad, with a third lead to the first source such that the third lead contacts the plurality of leads;
mounting a fourth lead to the first gate, the fourth lead contacting the plurality of leads;
mounting a fifth lead to the second gate, the fifth lead contacting the plurality of leads;
mounting a third die, with a third source, a third gate, and a third drain, to the second die attach pad such that the third drain electrically contacts the first drain through the first and second die attach pad;
mounting a fourth die with a fourth source, a fourth gate, and a fourth drain to a sixth die attach pad with a sixth lead such that the fourth drain contacts the sixth lead;
mounting the sixth die attach pad to the lead frame such that the third source contacts the sixth lead which contacts the plurality of leads;
mounting a seventh lead to the fourth gate, the seventh lead contacting the plurality of leads;
mounting a eighth lead to the third gate, the eighth lead contacting the plurality of leads; and
mounting a seventh die attach pad with a ninth lead to the lead frame such that the fourth source contacts the ninth lead which contacts the plurality of leads.

2. The process as recited in claim 1, further comprising the step of encasing the buck converter within a molding compound such that a portion of the plurality of leads extends outside of the molding compound.

3. The process as recited in claim 2, further comprising the step of cutting the lead frame from a magazine of lead frames, thus freeing the encased buck converter from the magazine of lead frames.

4. A process for forming a packaged multiphase buck converter, comprising the steps of:
providing a lead frame comprising a plurality of leads, a first die attach pad, a second die attach pad integral with the first die attach pad, a third die attach pad and a conductive bridge, each of which is electrically connected to the others, wherein the first and second die attach pads are in a first plane, the second die attach pad and third die attach pad being connected by the conductive bridge, the third die attach pad having a first lead;
mounting a first die to the first die attach pad;
mounting a second die to the third die attach pad; and
mounting a fourth die attach pad to the second die; and
bending the conductive bridge such that the first lead contacts one lead of the plurality of leads, and disposes the third die attach pad in a second plane parallel to, but separated from, the first plane and the fourth die attach pad in a third plane parallel to, but separated from the first and second planes.

5. The process as recited in claim 4, wherein the first die includes a first source, a first gate, and a first drain, the first die being mounted to the first die attach pad such that the first drain is electrically connected to the first die attach pad, and thus to the first lead.

6. The process as recited in claim 5, wherein the second die includes a second source, a second gate, and a second drain, the second die being mounted to the third die attach pad such that the second source is electrically connected to the third die attach pad, and thus to the first lead.

7. A process for forming a packaged multiphase buck converter, comprising the steps of:
providing a lead frame comprising a plurality of leads, a first die attach pad, a second die attach pad integral with the first die attach pad, a third die attach pad and a conductive bridge, each of which is electrically connected to the others, wherein the first and second die attach pads are in a first plane, the second die attach pad and third die attach pad being connected by the conductive, the third die attach pad having a first lead; and
bending the conductive bridge such that the first lead contacts one lead of the plurality of leads, and disposes the third die attach pad in a second plane parallel to, but separated from, the first plane; and disposing a fourth die attach pad in a third plane parallel to, but separated from the first and second planes.

* * * * *

UNITED STATES PATENT AND TRADEMARK OFFICE
CERTIFICATE OF CORRECTION

| | | |
|---|---|---|
| PATENT NO. | : 7,902,646 B2 | |
| APPLICATION NO. | : 12/723128 | |
| DATED | : March 8, 2011 | |
| INVENTOR(S) | : Yong Liu et al. | |

It is certified that error appears in the above-identified patent and that said Letters Patent is hereby corrected as shown below:

In claim 7, col. 6, line 59, the word "bridge" has been omitted.

Signed and Sealed this
Nineteenth Day of April, 2011

David J. Kappos
*Director of the United States Patent and Trademark Office*